(12) United States Patent
Oh et al.

(10) Patent No.: US 10,312,313 B2
(45) Date of Patent: Jun. 4, 2019

(54) DISPLAY DEVICE

(71) Applicant: Samsung Display Co., Ltd., Yongin-si (KR)

(72) Inventors: Hyun-Uk Oh, Seongnam-si (KR); Seong-Yul Yang, Suwon-si (KR); Eun Jung Oh, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 78 days.

(21) Appl. No.: 15/584,015

(22) Filed: May 1, 2017

(65) Prior Publication Data
US 2018/0069067 A1    Mar. 8, 2018

(30) Foreign Application Priority Data

Sep. 7, 2016   (KR) .................. 10-2016-0114965

(51) Int. Cl.
*H01L 27/32* (2006.01)
*H05K 1/11* (2006.01)
*H05K 1/18* (2006.01)
*H05K 1/14* (2006.01)

(52) U.S. Cl.
CPC ...... *H01L 27/3262* (2013.01); *H01L 27/3276* (2013.01); *H05K 1/111* (2013.01); *H05K 1/147* (2013.01); *H05K 1/181* (2013.01); *H05K 1/189* (2013.01); *H05K 2201/058* (2013.01); *H05K 2201/10128* (2013.01); *H05K 2201/10681* (2013.01)

(58) Field of Classification Search
CPC ........ H05K 1/147; H05K 3/326; H05K 1/111; H05K 1/118; H05K 1/189; H05K 1/181; H05K 2201/10681; H05K 2201/10128; H05K 2201/058
See application file for complete search history.

(56) References Cited

U.S. PATENT DOCUMENTS

| 2009/0194342 A1* | 8/2009 | Kuo ..................... G06F 3/0412 178/18.03 |
| 2009/0284909 A1* | 11/2009 | Liu ..................... G02F 1/1345 361/679.21 |
| 2009/0289885 A1* | 11/2009 | Chao .................... H05K 1/147 345/98 |

(Continued)

FOREIGN PATENT DOCUMENTS

| JP | 4304134 | 7/2006 |
| KR | 10-0977734 | 8/2010 |
| KR | 10-1292569 | 8/2013 |

*Primary Examiner* — Ibrahim A Khan
(74) *Attorney, Agent, or Firm* — H.C. Park & Associates, PLC

(57) ABSTRACT

A display device according includes a display panel configured to display an image, a first flexible printed circuit film, and a second flexible printed circuit film. The display panel has a first pad area and a second pad area, the first flexible printed circuit film has a third pad area and a fourth pad area, and the second flexible printed circuit film has a fifth pad area and a sixth pad area. The third pad area is bonded to the first pad area, the sixth pad area is bonded to the second pad area, and the fifth pad area is bonded to the fourth pad area. An integrated circuit chip is mounted on the first flexible printed circuit film.

18 Claims, 8 Drawing Sheets

(56) References Cited

U.S. PATENT DOCUMENTS

| | | | | |
|---|---|---|---|---|
| 2009/0303691 A1* | 12/2009 | Choi | ............... | H05K 1/147 361/768 |
| 2010/0220072 A1* | 9/2010 | Chien | ............... | G06F 3/041 345/173 |
| 2011/0235286 A1* | 9/2011 | Kitayama | ............... | G02F 1/13452 361/749 |
| 2011/0254758 A1* | 10/2011 | Lin | ............... | G02B 26/001 345/84 |
| 2012/0319967 A1* | 12/2012 | Tsai | ............... | G06F 1/1626 345/173 |
| 2013/0148312 A1* | 6/2013 | Han | ............... | H05K 7/00 361/736 |
| 2014/0022744 A1* | 1/2014 | Joo | ............... | H05K 5/0017 361/749 |
| 2014/0092034 A1* | 4/2014 | Franklin | ............... | G09F 13/0413 345/173 |
| 2014/0118969 A1* | 5/2014 | Lee | ............... | H01L 23/4985 361/749 |
| 2014/0239317 A1* | 8/2014 | Bang | ............... | H05K 1/147 257/88 |
| 2015/0208522 A1* | 7/2015 | Kim | ............... | H05K 1/028 361/749 |
| 2015/0228218 A1* | 8/2015 | Shim | ............... | G02F 1/13452 345/205 |
| 2015/0230337 A1* | 8/2015 | Kim | ............... | H05K 1/118 361/751 |
| 2016/0157372 A1 | 6/2016 | Hiroki | | |
| 2016/0224818 A1* | 8/2016 | Song | ............... | G06K 9/0002 |
| 2017/0148702 A1* | 5/2017 | Funayama | ............... | H01L 23/36 |
| 2017/0168463 A1* | 6/2017 | Hong | ............... | G02F 1/1345 |

* cited by examiner

DISPLAY DEVICE

CROSS-REFERENCE TO RELATED APPLICATION

This application claims priority from and the benefit of Korean Patent Application No. 10-2016-0114965, filed on Sep. 7, 2016, which is hereby incorporated by reference for all purposes as if fully set forth herein.

BACKGROUND

Field

The invention relates generally to display devices, and, more particularly, to display devices capable of accommodating an increased number of signals required for a high resolution display.

Discussion of the Background

Display devices such as an organic light emitting device and a liquid crystal display include a display panel in which pixels for displaying an image are provided. The display panel includes a pad area where pads for input and output of signals to control operation of the display panel are formed, and the pad area may be connected with a flexible printed circuit film to which an integrated circuit chip is mounted.

The flexible printed circuit film typically is a chip on film (COF) including a pad area at one end having pads corresponding to the pad area of the display so that the pad area of the COF may be bonded to the pad area of the display panel. The other end of the COF may be bonded to another flexible printed circuit film. The other flexible printed circuit film may be variously referred to as a flexible circuit film, a flexible printed circuit board (PCB), a flexible circuit board, film on film (FOF) and the like.

The demand for high resolution display devices requires an increase in the number of signals transmitted to the display panel to provide for high resolution such that the number of connection pads must also be increased. To increase the number of pads in a pad area of limited size, it is necessary to reduce the spacing between pads (pad pitch), however there are difficulties relating to manufacturing tolerances and/or bonding reliability that can arise when reducing pad pitch.

The above information disclosed in this Background section is only for enhancement of understanding of the background of the inventive concept, and, therefore, it may contain information that does not form the prior art that is already known in this country to a person of ordinary skill in the art.

SUMMARY

Display devices constructed according to the principles of the invention provide a high resolution display device including flexible printed circuit films to support a high resolution display that can accommodate the increased number of signals in a limited area without sacrificing quality or increasing manufacturing cost or complexity.

Various configurations of display devices constructed according to the inventive concepts permit the display panel and one of more of the flexible printed circuit board films to share pads. Thereby, the width of a relatively expensive flexible printed circuit film may be reduced and the pad pitch may be increased. In turn, the cost of manufacturing the display device is reduced.

Other configurations of display devices constructed according to the inventive concepts permit the display panel and one of more of the flexible printed circuit board films to share some pads while also providing one or more paths for transmitting signals to the display through pads that are not shared. Accordingly, bonding resistance, and thus the resistance of the entire signal transmitting wiring system, may be largely reduced. Thereby luminance uniformity of the display area and crosstalk may be improved by reducing load effects.

Display devices constructed according to the inventive concepts also provide a display device with improved display quality.

Additional aspects will be set forth in the detailed description which follows, and, in part, will be apparent from the disclosure, or may be learned by practice of the inventive concepts.

According to a first aspect of the invention, a display device includes a display panel configured to display an image having a first pad area and a second pad area; a first flexible printed circuit film having a third pad area and a fourth pad area and an integrated circuit chip mounted on the first flexible printed circuit film, wherein the third pad area is bonded to the first pad area; and a second flexible printed circuit film having a fifth pad area and a sixth pad area, wherein the fifth pad area is bonded to the fourth pad area and the sixth pad area is bonded to the second pad area.

The second flexible printed circuit film may include a main body part in which the fifth pad area is positioned, and an extension projecting from the main body part, the sixth pad area being disposed on the extension.

The second pad area may include a first pad part adjacent to one end of the first pad area and a second pad part adjacent to another end of the first pad area.

The extension may include a first extending part adjacent to one end of the first flexible printed circuit film and a second extending part adjacent to another end of the first flexible printed circuit film, and the sixth pad area may include a first pad part disposed in the first extending part and a second pad part disposed in the second extending part.

The first pad part of the sixth pad area may be bonded to the first pad part of the second pad area, and the second pad part of the sixth pad area may be bonded to the second pad part of the second pad area.

The display panel may include a display area having pixels configured to display an image and a non-display area having a driver configured to output gate signals. The integrated circuit chip may be configured to output data signals applied to the pixels, and to transmit the data signals to the display panel through pads disposed in the third pad area and the first pad area.

The integrated circuit chip may to configured to output gate basic signals supplied to the driver to generate the gate signals, and to transmit the gate basic signals to the second flexible printed circuit film through pads disposed in the fourth pad area and the fifth pad area and then to the display panel through pads disposed in the sixth pad area and the second pad area.

The second flexible printed circuit film may include a stabilization circuit configured to transmit at least a portion of the gate basic signals to pads disposed in the sixth pad area.

The display device may further include a power source module configured to generate voltages to drive the pixels in the display panel through pads disposed in the sixth pad area and the second pad area.

The display panel may further include a lighting circuit portion positioned in the non-display area. The integrated circuit chip may be configured to output constant voltages applied to the lighting circuit portion, and to transmit the constant voltages to the display panel through pads disposed in the sixth pad area and the second pad area.

The first pad area and the second pad area may be disposed on a line in a first direction.

The second flexible printed circuit film may include a main body part having the fifth pad area, an extension projecting from the main body part, and a connection part that extends from the extension having the sixth pad area.

The first pad area and the second pad area may be disposed along different lines, each of which is substantially parallel to a first direction.

The first pad area may be disposed at a more outer part of the display panel than the second pad area.

The extension may include a first extending part adjacent to one end of the first flexible printed circuit film and a second extending part adjacent to another end of the first flexible printed circuit film, and the connection part may extend from the first extending part and the second extending part substantially parallel to the first pad area.

The second flexible printed circuit film may have an opening defined by the main body part, the first extending part, the second extending part, and the connection part.

The second flexible printed circuit film may overlap a region between the third pad area of the first flexible printed circuit film and the integrated circuit chip.

The second flexible printed circuit film may have an opening overlapping the integrated circuit chip.

The display panel may include a display area having pixels configured to display an image and a non-display area having the first pad area and the second pad area, and the first pad area may be positioned farther away from the display area than the second pad area.

In the display panel, a part where the first pad area is disposed may project outwardly away from the display area farther than a part where the second pad area is disposed.

Because some signal lines may be directly connected to the display panel through the second flexible printed circuit film, pads of a number corresponding to high resolution may be obtained through the first flexible printed circuit film of a predetermined width, in which the integrated circuit chip is mounted.

Also, the resistance may be reduced due to the direct connection of the second flexible printed circuit film to the display panel, thereby improving luminance uniformity and RGB crosstalk of the display device.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
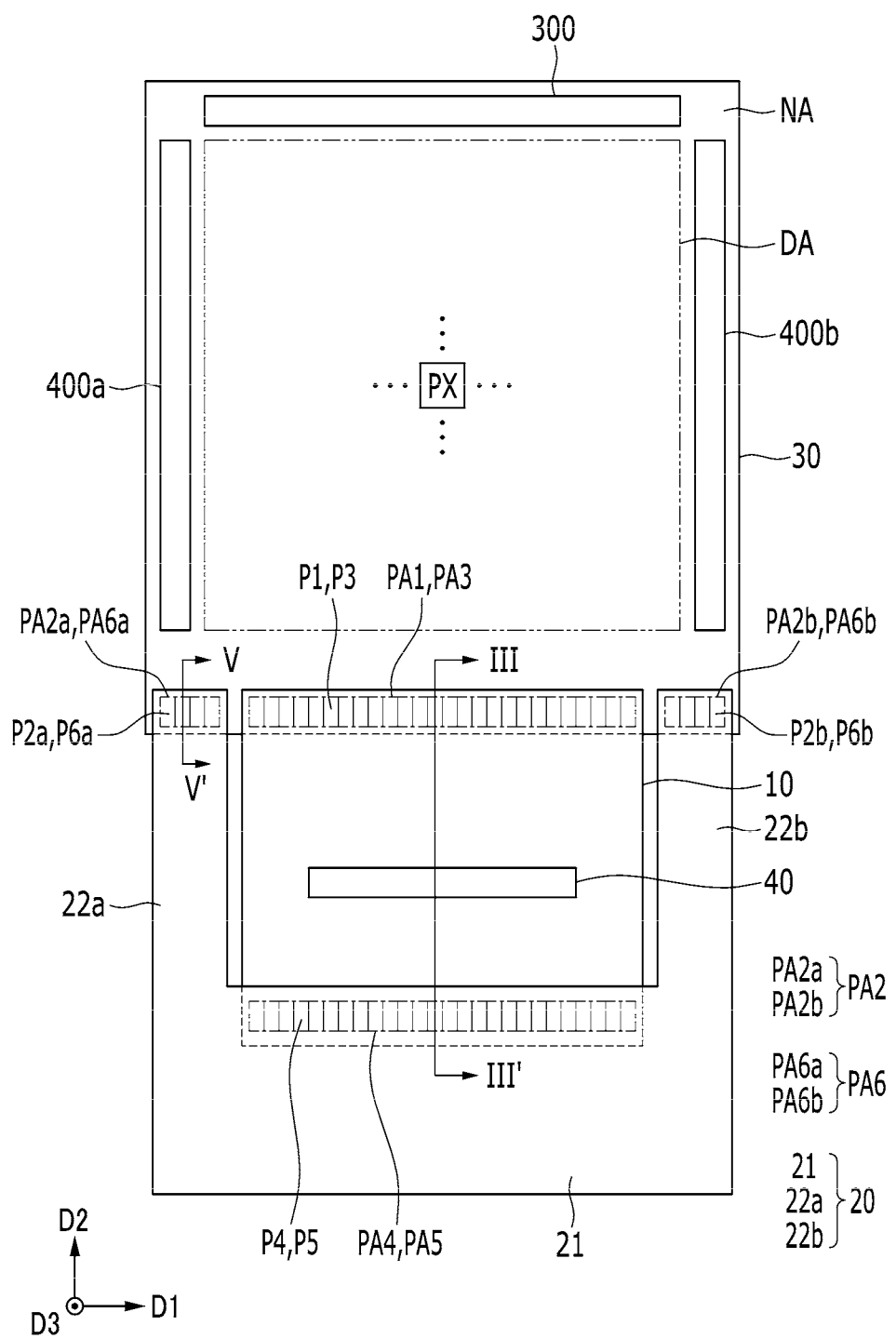
FIG. 1 is a schematic plan view of a first embodiment of a display device constructed according to the principles of the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
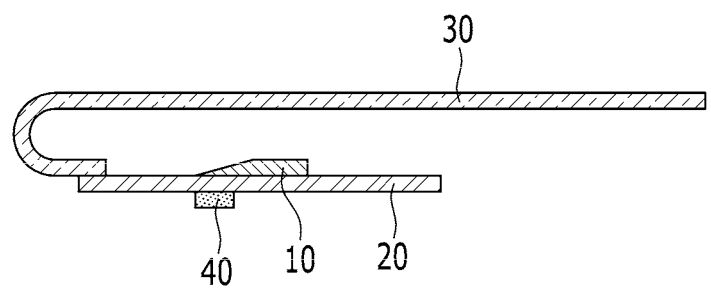
FIG. 2 is a schematic side view of a stage of the display device of FIG. 1 after bending the display device.

Referring to FIG. 1, the display device includes a display panel 30, and a first flexible printed circuit film 10 and a second flexible printed circuit film 20 that are each connected to the display panel 30. The display panel 30, for example, is bent with respect to an axis approximately parallel to a first direction D1 such that, for example as shown in FIG. 2, the first flexible printed circuit film 10 and the second flexible printed circuit film 20 may be positioned at a rear side of the display panel 30. Alternatively, the display panel 30 is not bent, and the first flexible printed circuit film 10 and the second flexible printed circuit film 20 are bent at the axis approximately parallel to the first direction D1 such that a part of the first flexible printed circuit film 10 and the second flexible printed circuit film 20 may be positioned at the rear side of the display panel 30. The display panel 30 includes a display area DA displaying an image, and a non-display area (NA) in which elements and signal lines to generate and/or transmit various signals applied to the display area DA are disposed and that is positioned near the display area DA. The display panel 30 may have a plane shape of an approximate quadrangle, however it is not limited thereto.

Referring to FIG. 1, FIG. 2, FIG. 3, and FIG. 5, in the non-display area NA of the display panel 30, a first pad area PA1 and a second pad area PA2 where pads P1, P2a, and P2b corresponding to input and output connection terminals to receive the signals from outside of the display panel 30 are arranged and positioned on a substrate 310. The first flexible printed circuit film 10 is bonded to the first pad area PA1, and the second flexible printed circuit film 20 is bonded to the second pad area PA2.

The first pad area PA1 and the second pad area PA2 may be positioned at one edge of the display panel 30. The first pad area PA1 and the second pad area PA2 may be positioned on the same line in one direction, for example, in the first direction D1. The second pad area PA2 includes a first pad part PA2a and a second pad part PA2b that are respectively positioned at a left side and a right side of the first pad area PA1.

The first flexible printed circuit film 10 has an overall shape at least approximating a quadrangle. The first flexible printed circuit film 10 includes a third pad area PA3 on one edge of a base film 110 and a fourth pad area PA4 on the other edge, and the pad areas PA3 and PA4 respectively include the pads P3 and P4. The third pad area PA3 of the first flexible printed circuit film 10 is bonded to the first pad area PA1 of the display panel 30 by any means known in the art to electrically connect the corresponding pads P1 and P3.

The second flexible printed circuit film 20 includes a body part 21 of an approximately quadrangle and a first extending part 22a and a second extending part 22b approximately extending in parallel from opposite sides of the body part 21. The second flexible printed circuit film 20 includes a fifth pad area PA5 and a sixth pad area PA6 formed on a base film 210. The fifth pad area PA5 may be positioned at the edge of the body part 21 close to the first flexible printed circuit film 10. The sixth pad area PA6 includes a first pad part PA6a that may be positioned at the edge of the first extending part 22a and a second pad part PA6b that may be positioned at the edge of the second extending part 22b. The fifth pad area PA5 is bonded to the fourth pad area PA4 of the first flexible printed circuit film 10 to electrically connect the corresponding pads P4 and P5. The first pad part PA6a and the second pad part PA6b of the sixth pad area PA6 are respectively bonded to the first pad part PA2a and the second pad part PA2b of the second pad area PA2 of the display panel 30 to electrically connect the corresponding pads P2a and P6a, and P2b and P6b. This bonding may be performed by any means known in the art such as pressing, for example, the pad areas by using a pressing tool after positioning the corresponding pad areas to be overlapped.

In other embodiments, the second pad area PA2 of the display panel 30 is not divided into the pad parts PA2a and PA2*b*, but may be positioned in only the right side or the left side of the first pad area PA1. Correspondingly, the sixth pad area PA6 of the second flexible printed circuit film 20 might also not be divided into the pad parts PA6*a* and PA6*b*, but might only include one of the first extending part 22*a* and the second extending part 22*b*.

Figure 3:
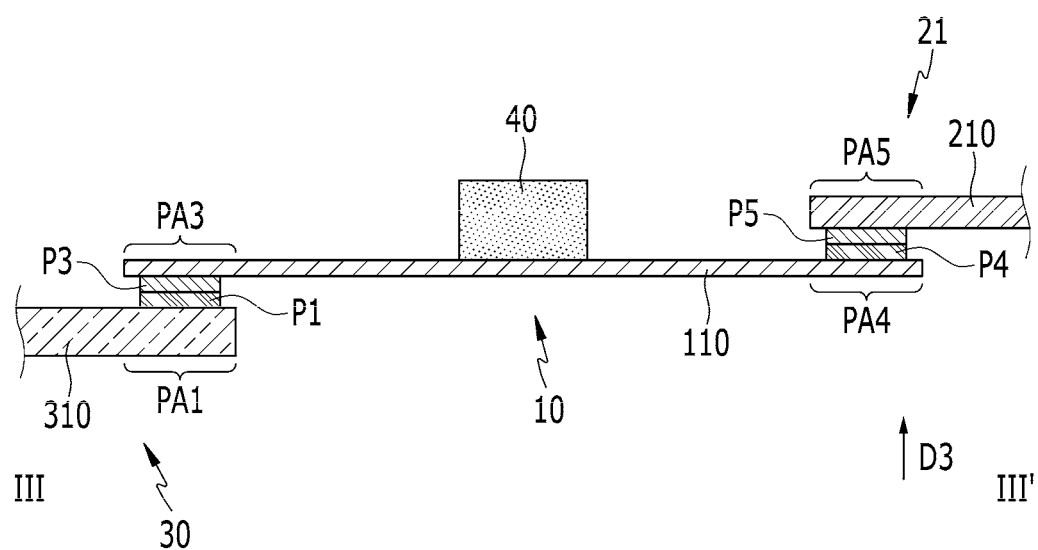
FIG. 3 is a cross-sectional view taken along line III-III' of FIG. 1.
Figure 4:
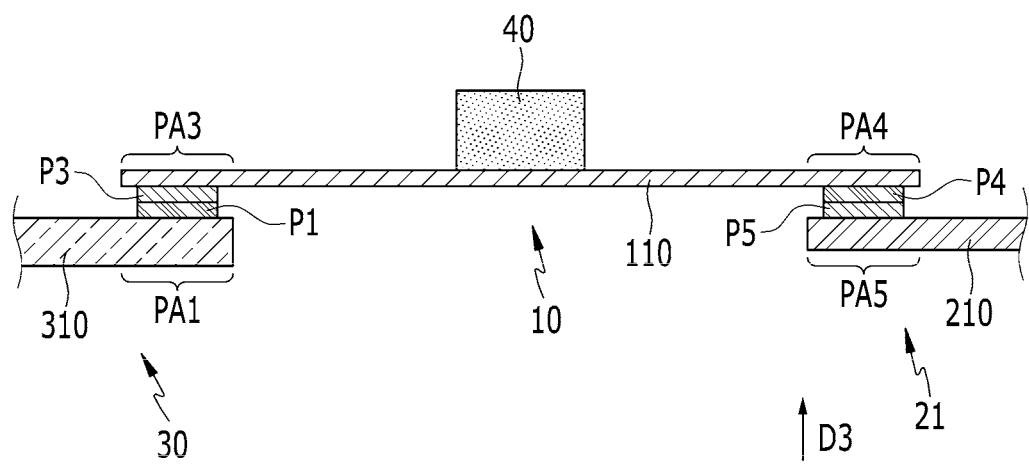
FIG. 4 is a cross-sectional view showing an exemplary variation of FIG. 3.
Figure 5:
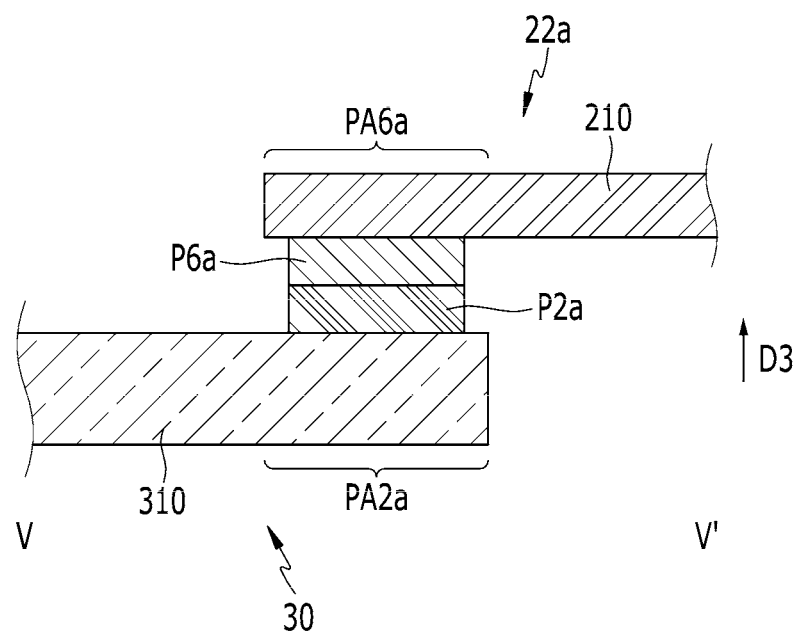
FIG. 5 is a cross-sectional view taken along line V-V of FIG. 1.

As shown in FIG. 3, the fifth pad area PA5 of the second flexible printed circuit film 20 may be positioned on the fourth pad area PA4 of the first flexible printed circuit film 10. In this case, the pads P5 of the fifth pad area PA5 of the second flexible printed circuit film 20 and the pads P6*a* and P6*b* of the sixth region PA6 are positioned on the same surface of the base film 210. However, the pads P3 of the third pad area PA3 of the first flexible printed circuit film 10 and the pads P4 of the fourth pad area PA4 may be positioned on different surfaces of the base film 110. Alternatively, as shown in FIG. 4, the fifth pad area PA5 of the second flexible printed circuit film 20 may be positioned under the fourth pad area PA4 of the first flexible printed circuit film 10. In this case, the pads P3 of the third pad area PA3 of the first flexible printed circuit film 10 and the pads P4 of the fourth pad area PA4 may be positioned on the same surface of the base film 110, and the pads P5 of the fifth pad area PA5 of the second flexible printed circuit film 20 and the pads P6*a* and P6*b* of the sixth pad area PA6 may be positioned on different surfaces of the base film 210. In FIG. 3, FIG. 4, and FIG. 5, the third pad area PA3 of the first flexible printed circuit film 10 and the sixth pad area PA6 of the second flexible printed circuit film 20 are positioned on the first pad area PA1 and the second pad area PA2 of the display panel 30, however relative positions of the pad areas related to the bond direction may be variously changed.

For the bonding of the corresponding pad areas PA1 and PA3, PA4 and PA6, PA2*a* and PA6*a*, and PA2*b* and PA6*b*, a bonding means known in the art such as an adhesive may be positioned between the corresponding pad areas. For the electrical connection of the corresponding pads P1 and P3, P4 and P5, P2*a* and P6*a*, and P2*b* and P6*b*, the corresponding pads may be directly connected as shown, however a conductor or a connection member such as a conductive particle or a solder may be positioned between the corresponding pads.

The display device includes a driving device generating and/or processing various signals to drive the display panel 30. The driving device may include gate drivers 400*a* and 400*b*, a data driver, and a signal controller controlling the gate drivers 400*a* and 400*b* and the data driver.

The gate drivers 400*a* and 400*b* may be integrated on the non-display area NA of the display panel 30. The gate drivers 400*a* and 400*b* may include a first gate driver 400*a* and a second gate driver 400*b* that are respectively positioned on the left side and the right side of the display area DA. The gate driver might be positioned at only one of the right side and the left side of the display area DA, might be positioned at an upper side or a lower side of the display area DA, or may be electrically connected to the display panel 30 in a tape carrier package (TCP) form.

The data driver and the signal controller are provided as one integrated circuit chip 40 that is mounted on the first flexible printed circuit film 10. Accordingly, the first flexible printed circuit film 10 may be referred to as a chip on film (COF). A portion of the signals output from the integrated circuit chip 40 is transmitted to the display panel 30 through the third pad area PA3 and the first pad area PA1, and a portion is transmitted to the display panel 30 through the sixth pad area PA6 and second pad area PA2 after passing through the fourth pad area PA4 and the fifth pad area PA5. Accordingly, a portion of the output signals of the integrated circuit chip 40 is directly transmitted to the display panel 30 from the first flexible printed circuit film 10 and a portion is transmitted to the display panel 30 via the second flexible printed circuit film 20. The data driver and the signal controller may be formed as separate chips, and the signal controller may be positioned outside the first flexible printed circuit film 10.

A lighting circuit portion 300 may be further positioned in the non-display area NA of the display panel 30. The lighting circuit portion 300 may be positioned on an upper side of the display area DA, for example. The lighting circuit portion 300 includes a transistor, and may test for the existence of a crack in the display panel 30.

As described above, if the first flexible printed circuit film 10 and the second flexible printed circuit film 20 are both connected to the display panel 30, the display panel 30 as well as the first flexible printed circuit film 10 may receive the several signals to operate the display panel 30 from the second flexible printed circuit film 20. As the second flexible printed circuit film 20 shares the pads to transmit the signals to the display panel 30, the number of pads that must be formed on the first flexible printed circuit film 10 may be reduced.

For example, when pads of an n number to transmit the signals to the display panel 30 are needed and the third pad area PA3 only includes pads of an m number that is smaller than the n number by its limitation of the first flexible printed circuit film 10, the pads may be obtained to be suitable for a condition by disposing the pads of an (n−m) number in the sixth pad area PA6 of the second flexible printed circuit film 20. Accordingly, embodiments of display the device employing the inventive concepts may provide high resolution that may require thousands of pads, for example. As an example, pads that may correspond to a WQHD resolution (e.g., 2560*1440) may be provided even if a first flexible printed circuit film 10 having a width of about 48 mm is used. Also, by as much as the second flexible printed circuit film 20 shares the pads, the width of the first flexible printed circuit film 10 that is relatively expensive may be reduced, thereby reducing a manufacturing cost.

Thus far, the display device has been described focusing the connection of the display panel 30, the first flexible printed circuit film 10, and the second flexible printed circuit film 20. Hereafter, the various signals applied to the display panel 30 and the wires transmitting the signals will be described with reference to FIG. 6.

Figure 6:
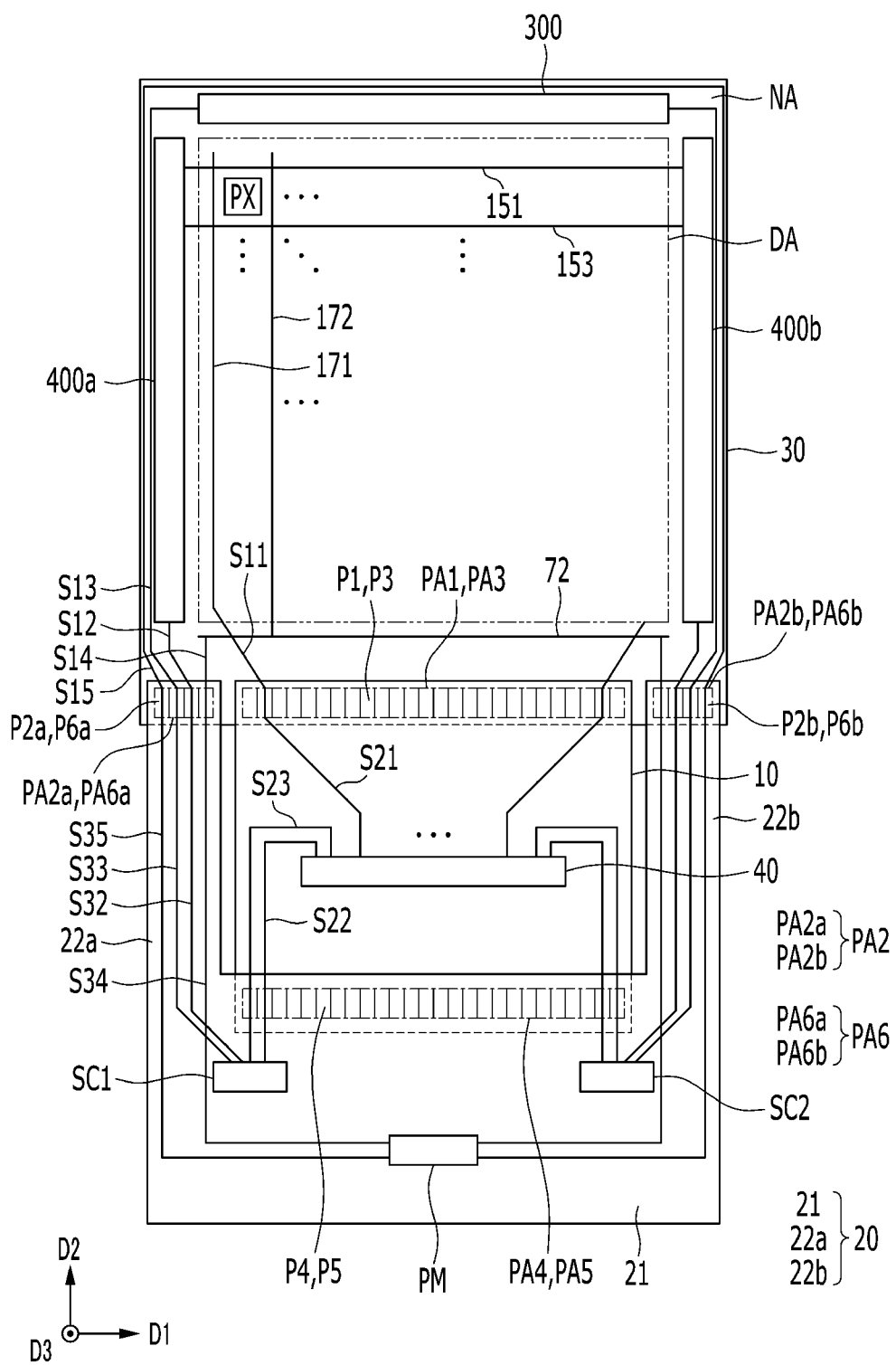
FIG. 6 is a plan view showing further detail of the embodiment of FIG. 1.

Referring to FIG. 6, the wires that are disposed in the display panel 30, the first flexible printed circuit film 10, and the second flexible printed circuit film 20 are diagrammatically shown.

The pixels PX, for example, are disposed in a matrix form on the display area DA of the display panel 30, and signal lines such as gate lines 151, light emission control lines 153, data lines 171, and driving voltage lines 172 are also disposed on the display panel 30. The gate lines 151 and the light emission control lines 153 may mainly extend in the first direction D1 (e.g., in a row direction), and the data lines 171 and the driving voltage lines 172 may mainly extend in a second direction D2 (e.g., in a column direction) crossing the first direction D1. The gate line 151, the light emission control line 153, the data line 171, and the driving voltage line 172 are connected to each pixel PX. Each pixel PX receives a gate signal and a light emission control signal output from the gate drivers 400*a* and 400*b* through the gate line 151 and the light emission control line 153, receives a data signal output from the data driver through the data line 171, and receives the driving voltage through the driving voltage line 172.

A sensor layer to sense a touch of a user may be positioned in the display area DA. A quadrangular display area DA is shown, however the display area DA may have various shapes such as polygonal, circular, or oval as well as quadrangular.

In the non-display area NA, first, second, third, fourth, and fifth signal lines S11, S12, S13, S14, and S15 are positioned to transmit the signals to the display area DA, the gate drivers 400a and 400b, and the lighting circuit portion 300. The second and third signal lines S12 and S13 are shown as one line to avoid complication of the drawing, however they include a plurality of signal lines, respectively. The fourth and fifth signal lines S14 and S15 may respectively include at least one signal line.

The first, second, third, fourth, and fifth signal lines S11, S12, S13, S14, and S15 may be disposed approximately symmetrically left and right with respect to the center of the display panel 30. Next, the connection of the signal lines will be described for the left region of the display panel 30. The right region symmetrically corresponds to the following description for the left region.

The first signal lines S11 are connected to the pads P1 and the data lines 171 in the first pad area PA1. The second signal lines S12 are connected to the pads P2a and the gate driver 400a in the first pad part PA2a of the second pad area PA2. The third signal lines S13 are connected to the pads P2a and the lighting circuit portion 300 in the first pad part PA2a. The fourth signal line S14 is connected to the pad P2a and the driving voltage transmitting line 72 in the first pad part PA2a, and the driving voltage transmitting line 72 is connected to the driving voltage lines 172 of the display area DA. The fifth signal line S15 is connected to the pad P2a in the first pad part PA2a and may extend outside the gate driver 400a. The fifth signal line S15 may function as a guard ring. The non-display area NA may include signal lines used for driving of the pixels PX, for example, a signal line transmitting an initialization voltage.

The integrated circuit chip 40 mounted on the first flexible printed circuit film 10 generates and outputs the data signals, and the gate drivers 400a and 400b generate and outputs signal (hereinafter referred to as gate basic signals) used to generate the gate signals. These gate basic signals, for example, may include a gate low voltage, a gate high voltage, a clock signal, a frame signal, a light emission clock signal, a light emission frame signal, and the like. The gate low voltage and the gate high voltage may be used to generate a low voltage level and a high voltage level of the gate signal in the gate drivers 400a and 400b. The frame signal and the light emission frame signal may instruct the start of one frame for inputting the gate signal and the light emission control signal to the display area DA.

The integrated circuit chip 40 may generate and output an RGB constant voltage and a gate constant voltage that are transmitted to the lighting circuit portion 300. The RGB constant voltage and the gate constant voltage may be respectively transmitted to an input terminal and a control terminal of the transistor included in the lighting circuit portion 300.

The first flexible printed circuit film 10 includes the first signal lines S21 connected to the integrated circuit chip 40 and the pads P3 in the third pad area PA3, and includes the second and third signal lines S22 and S23 connected to the integrated circuit chip 40 and the pads P4 in the fourth pad area PA4.

Stabilization circuits SC1 and SC2 are formed on the second flexible printed circuit film 20. In the second flexible printed circuit film 20, a power module (PM) generating power source voltages including a driving voltage and a common voltage is positioned. The power source module (PM) may be provided in an integrated circuit chip form and may be positioned in an external printed circuit board (PCB) connected to the second flexible printed circuit film 20. The second flexible printed circuit film 20 may receive image data and a power source voltage from the external printed circuit board (PCB), and the input image data may be transmitted to the integrated circuit chip 40 mounted on the first flexible printed circuit film 10 through the fifth pad area PA5 and the fourth pad area PA4 that are bonded to each other.

The second flexible printed circuit film 20 includes the second and third signal lines S32 and S33 connecting the pads P5 in the fifth pad area PA5 and the pads P6a in the first pad part PA6a of the sixth pad area PA6, and includes the fourth and fifth signal lines S34 and S35 connecting the power source module (PM) and the pads P6a of the first pad part PA6a.

The data signals output from the integrated circuit chip 40 are transmitted to the first signal lines S11 of the display panel 30 through the first signal lines S21 of the first flexible printed circuit film 10, the pads P3 of the third pad area PA3, and the pads P1 of the first pad area PA1.

The gate basic signals are transmitted to the second signal lines S12 of the display panel 30 through the second signal lines S22 of the first flexible printed circuit film 10, the pads P4 of the fourth pad area PA4, the pads P5 of the fifth pad area PA5, the second signal lines S32 of the second flexible printed circuit film 20, the pads P6a of the first pad part PA6a of the sixth pad area PA6, and the pads P2a of the first pad part PA2a of the second pad area PA2.

Like the gate basic signals, the RGB constant voltage and the gate constant voltage are transmitted to the third signal lines S13 of the display panel 30 through the third signal lines S23 of the first flexible printed circuit film 10, the pads P4 of the fourth pad area PA4, the pads P5 of the fifth pad area PA5, the third signal lines S33 of the second flexible printed circuit film 20, the pads P6a of the first pad part PA6a of the sixth pad area PA6, and the pads P2a of the second pad area PA2 of the first pad part PA2a.

The gate basic signals, the RGB constant voltage, and the gate constant voltage may be stabilized through the stabilization circuit SC1 and a noise may be removed. Depending on a design, a portion of the signals might not pass through the stabilization circuit SC1.

The driving voltage generated from the power source module PM is transmitted to the fourth signal line S14 of the display panel 30 through the fourth signal line S34 of the second flexible printed circuit film 20, the pad P6a of the first pad part PA6a of the sixth pad area PA6, and the pad P2a of the first pad part PA2a of the second pad area PA2. The common voltage generated from the power source module PM is transmitted to the fifth signal line S15 of the display panel 30 through the fifth signal line S35 of the second flexible printed circuit film 20, the pad P6a of the first pad part PA6a of the sixth pad area PA6, and the pad P2a of the first pad part PA2a of the second pad area PA2.

The portion of the above-described signal lines might not be included, depending on the design of the display device, and signal lines transmitting different signals from the above-described signals may be further included.

In general, the signals transmitted through the stabilization circuit SC1 positioned in the second flexible printed circuit film 20 after being outputted from the integrated circuit chip 40 positioned in the first flexible printed circuit film 10 are again transmitted to the display panel 30 through the first flexible printed circuit film 10. Accordingly, these signals pass the fourth pad area PA4 and the fifth pad area PA5 twice. Also, the driving voltage and the common voltage are transmitted from the second flexible printed circuit film 20 to the display panel 30 through the first flexible printed circuit film 10. Accordingly, the driving voltage and the common voltage pass the fourth pad area PA4 and the fifth pad area PA5 once.

By the connection structure of the above-described signal transmitting wires, the signals that are transmitted from the first flexible printed circuit film 10 and pass the stabilization circuit SC1 are not returned into the first flexible printed circuit film 10, but are transmitted directly to the display panel 30 from the second flexible printed circuit film 20 such that the signals pass the fourth pad area PA4 and the fifth pad area PA5 only once. Also, the driving voltage and the common voltage are transmitted directly from the second flexible printed circuit film 20 to the display panel 30 without passing the fourth pad area PA4 and the fifth pad area PA5. Bonding resistance formed in the part where two pad areas are bonded represents a large proportion in the entire resistance of a signal transmitting wiring system of the display device. Since the signals such as the gate basic signals or the power source voltages do not pass the fourth pad area PA4 and the fifth pad area PA5 or pass only once, the resistance of the signal transmitting wiring system may be largely reduced, thereby luminance uniformity of the display area DA and RGB crosstalk may be improved by reducing a load effect. Also, the pads to return the signals passing the stabilization circuit SC1 to the first flexible printed circuit film 10 and the pads to transmit the driving voltage and the common voltage to the first flexible printed circuit film 10 are not required such that the number of pads P4 positioned in the fourth pad area PA4 may be reduced. Accordingly, the width of the first flexible printed circuit film 10 may be reduced and a design margin such as a pad pitch may be increased.

Figure 7:
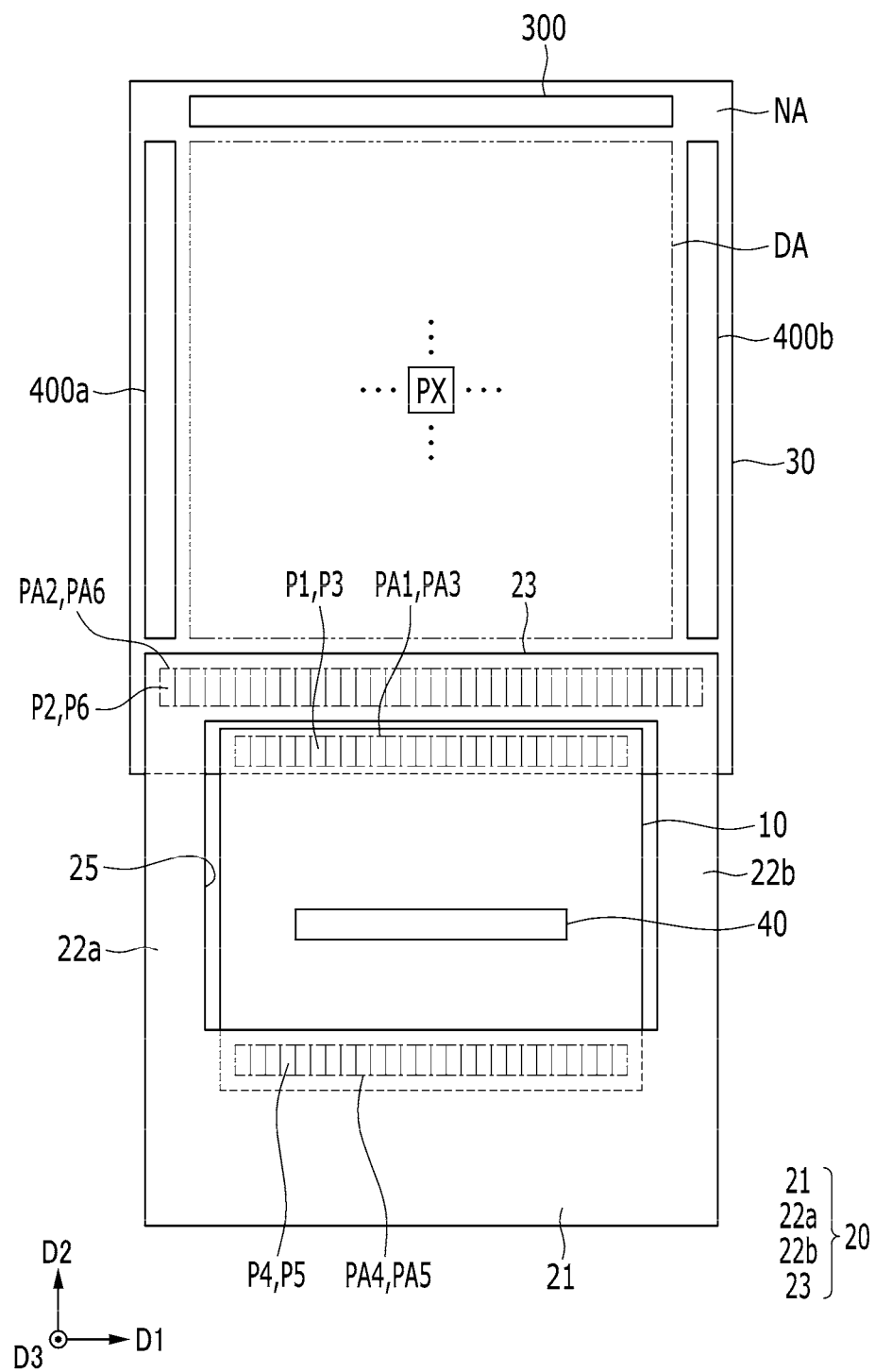
FIG. 7 is a schematic plan view of a second embodiment of a display device constructed according to the principles of the invention.
Figure 8:
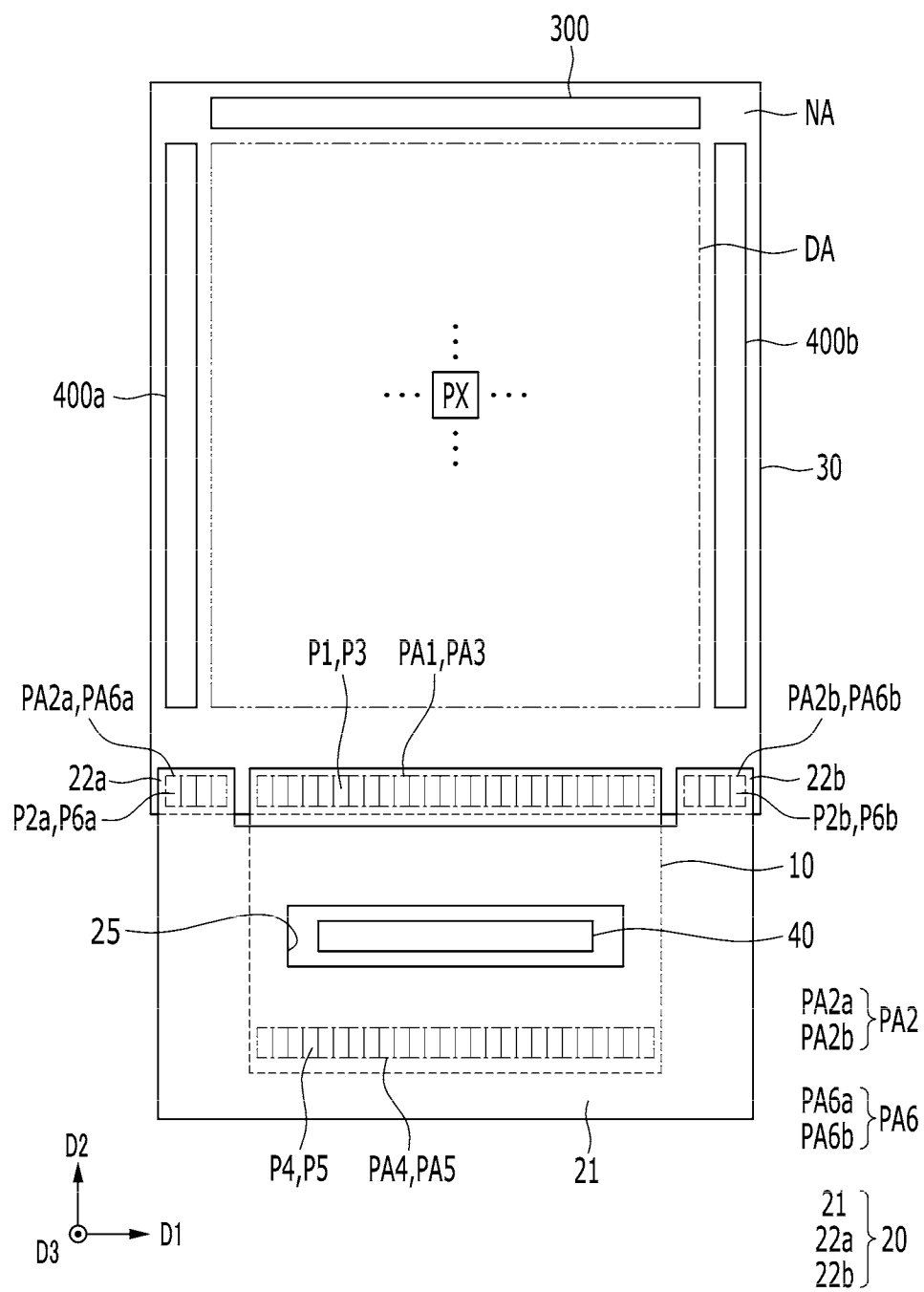
FIG. 8 is a schematic plan view of a third embodiment of a display device constructed according to the principles of the invention.
Figure 9:
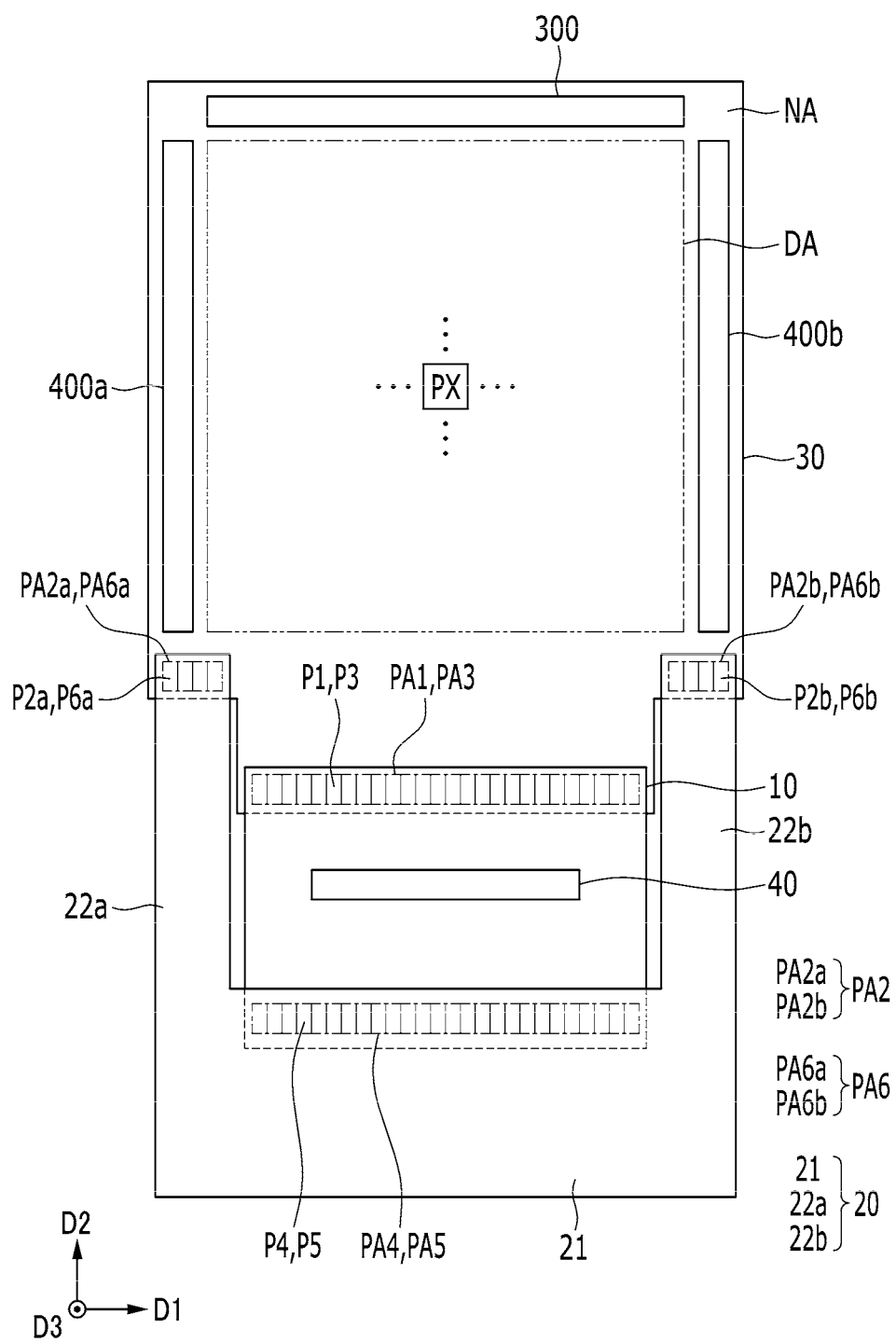
FIG. 9 is a schematic plan view of a fourth embodiment of a display device constructed according to the principles of the invention.

FIG. 7, FIG. 8, and FIG. 9 illustrate additional examples of display devises according to the principles of the invention.

Referring to FIG. 7, the first flexible printed circuit film 10 mounted with the integrated circuit chip 40 includes the third pad area PA3 and the fourth pad area PA4 on respective ends, and the third pad area PA3 is bonded to the first pad area PA1 positioned at the edge of the display panel 30. The second flexible printed circuit film 20 includes the body part 21 and the first extending part 22a and the second extending part 22b extending approximately in parallel from both sides of the body part 21, and includes a connection part 23 extending to be approximately parallel to the body part 21 from the first extending part 22a and the second extending part 22b. Accordingly, the second flexible printed circuit film 20 has an opening 25 defined by the body part 21, the first extending part 22a, the second extending part 22b, and the connection part 23, which may be integrally formed.

Like the above-described exemplary embodiment of FIG. 1, the fifth pad area PA5 of the second flexible printed circuit film 20 bonded to the fourth pad area PA4 of the first flexible printed circuit film 10 is positioned in the body part 21. However, the sixth pad area PA6 bonded to the second pad area PA2 of the display panel 30 is positioned in the connection part 23. For the bonding with the sixth pad area PA6, the second pad area PA2 of the display panel 30 is positioned at the upper side (e.g., between the first pad area PA1 and the display area DA) of the first pad area PA1, not the right side and/or the left side of the first pad area PA1. Accordingly, the sixth pad area PA6 is bonded to the second pad area PA2 to be positioned approximately parallel to the first pad area PA1 in the first direction D1.

In the case of the exemplary embodiment of FIG. 1, since the first pad part PA6a and the second pad part PA6b of the sixth pad area PA6 respectively extend well away from the body part 21 and are disposed at the edge of the first extending part 22a and the second extending part 22b, it may be more challenging for the first pad part PA6a and the second pad part PA6b of the sixth pad area PA6 to be correctly aligned to the first pad part PA2a and the second pad part PA2b of the second pad area PA2. In the embodiment of FIG. 7, since one sixth pad area PA6 is formed, it may be easier to correctly align the respective pad areas as compared to the embodiment of FIG. 1. However, to provide the second pad area PA2 on the first pad area PA1, the non-display area NA of the display panel 30 may have to be increased.

Referring to FIG. 8, like the exemplary embodiment of the FIG. 1, the first flexible printed circuit film 10 to which the integrated circuit chip 40 is mounted includes the third pad area PA3 and the fourth pad area PA4 on respective ends, and the third pad area PA3 is bonded to the first pad area PA1 positioned at the edge of the display panel 30. The second flexible printed circuit film 20 includes the body part 21, and the first extending part 22a and the second extending part 22b extending to be approximately parallel from both sides of the body part 21. The fifth pad area PA5 is positioned at the body part 21, and the sixth pad area PA6 includes the first pad part PA6a positioned at the edge of the first extending part 22a and the second pad part PA6b positioned at the edge of the second extending part 22b.

However, in contrast to the embodiment of FIG. 1 where the first extending part 22a and the second extending part 22b extent well away from the body part 21 such that the second flexible printed circuit film 20 substantially overlaps the first flexible printed circuit film 10 only in the fifth pad area PA5, in the embodiment of FIG. 8 the first extending part 22a and the second extending part 22b may be much shorter. Accordingly, this embodiment minimizes the increase of the entire size of the second flexible printed circuit film 20 caused by the first extending part 22a and the second extending part 22b. Instead, since most of the portion of the second flexible printed circuit film 20 overlaps the first flexible printed circuit film 10, when the first flexible printed circuit film 10 is disposed under the second flexible printed circuit film 20, the second flexible printed circuit film 20 may have the opening 25 at the region of the body part 21 overlapping the integrated circuit chip 40 to expose only the integrated circuit chip 40 mounted to the first flexible printed circuit film 10. Alternatively, when the first flexible printed circuit film 10 is positioned on the second flexible printed circuit film 20, the opening 25 might be omitted.

Referring to FIG. 9, at the edge of the display panel 30 in which the first pad area PA1 and the second pad area PA2 are positioned, the portion where the first pad area PA1 is provided projects outwardly from the display area DA. However, the part of the display area DA where the second pad area PA2 is provided does not similarly project. Thus, the first pad area PA1 and the second pad area PA2 are not disposed on the same line in the first direction D1, whereas, in the exemplary embodiment of FIG. 1, the first pad area PA1 and the second pad area PA2 are positioned to be approximately in a line in the first direction D1. In the embodiment of FIG. 9, the first pad area PA1 to which the third pad area PA3 of the first flexible printed circuit film 10 is bonded is positioned farther away from the display area DA than the second pad area PA2. For the bonding with the second pad area PA2, the first extending part 22a and the second extending part 22b of the second flexible printed circuit film 20 may be elongated more than they are in the embodiment of FIG. 1.

This structure might be beneficial when designing the region between the first pad area PA1 and the second pad area PA2 of the display panel 30 to be bent, for example, in the second direction D2 based on a bending axis that is approximately parallel to the first direction D1. In this case, the first extending part 22a and the second extending part 22b of the second flexible printed circuit film 20 may be bent along with the display panel 30 as both sides of the display panel 30.

Figure 10:
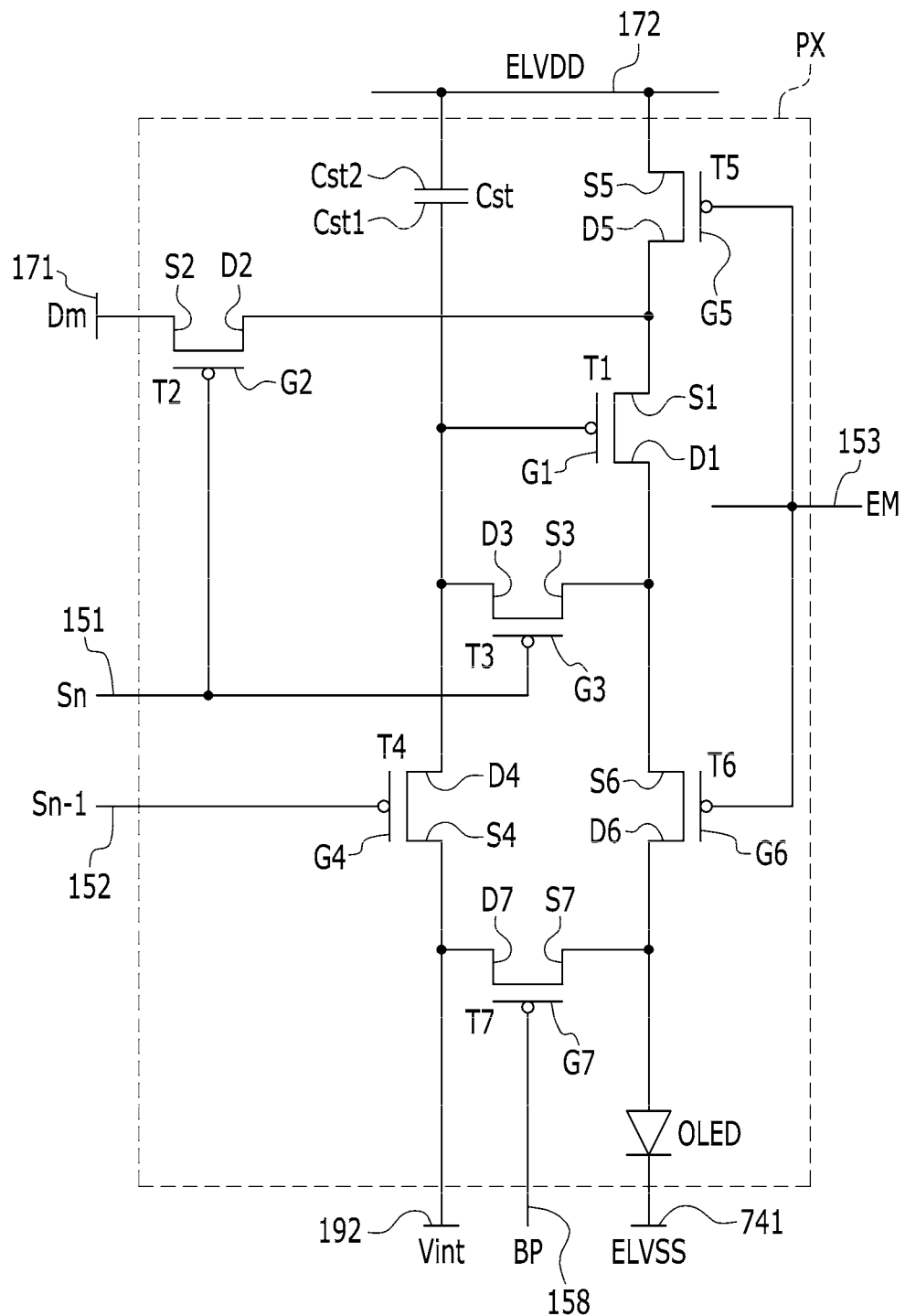
FIG. 10 is an equivalent circuit diagram of one pixel of a display device constructed according to the principles of the invention.

An equivalent circuit diagram for one of the pixels that may be used in a display device constructed according to the principles of the invention is described in reference to FIGS. 6 and 10. Referring to FIG. 10, the exemplary pixel PX positioned at the display area DA in the display device may include transistors T1, T2, T3, T4, T5, T6, and T7, a storage capacitor Cst, and an organic light emitting diode (OLED) connected to display signal lines 151, 152, 153, 158, 171, 172, and 192.

The transistors T1, T2, T3, T4, T5, T6, and T7 may include a driving transistor T1, a switching transistor T2, a compensation transistor T3, an initialization transistor T4, an operation control transistor T5, a light emission control transistor T6, and a bypass transistor T7.

The display signal lines 151, 152, 153, 158, 171, 172, and 192 may include a gate line 151, a previous gate line 152, a light emission control line 153, a bypass control line 158, a data line 171, a driving voltage line 172, and an initialization voltage line 192. The gate line 151 and the previous gate line 152 may be connected to the gate signal generating circuit of the aforementioned gate drivers 400a and 400b to respectively receive a gate signal Sn and a previous gate signal S(n−1), and the light emission control line 153 may connected to the light emission control signal generating circuit of the gate drivers 400a and 400b to receive a light emission control signal EM.

The previous gate line 152 transmits the previous gate signal S(n−1) to the initialization transistor T4, the light emission control line 153 transmits the light emission control signal EM to the operation control transistor T5 and the light emission transistor T6, and the bypass control line 158 transmits the bypass signal BP to the bypass transistor T7.

The data line 171 may receive the data signal Dm through the above-described first signal line S11, and the driving voltage line 172 may receive the driving voltage ELVDD through the above-described fourth signal line S14 and the driving voltage transmitting line 72. The initialization voltage line 192 may receive the initialization voltage Vint initializing the driving transistor T1 through the signal line transmitting the initialization voltage Vint.

The gate electrode G1 of the driving transistor T1 is connected to the first electrode Cst1 of the storage capacitor Cst. The source electrode S1 driving transistor T1 is connected to the driving voltage line 172 via the operation control transistor T5. The drain electrode D1 of the driving transistor T1 is connected to an anode of the organic light emitting diode (OLED) via the light emission control transistor T6.

A gate electrode G2 of the switching transistor T2 is connected with the gate line 151. The source electrode S2 of the switching transistor T2 is connected to the data line 171.

The drain electrode D2 of the switching transistor T2 is connected to the source electrode S1 of the driving transistor T1 and is connected to the driving voltage line 172 via the operation control transistor T5.

The gate electrode G3 of the compensation transistor T3 is connected to the gate line 151. The source electrode S3 of the compensation transistor T3 is connected to the drain electrode D1 of the driving transistor T1 and is connected to the anode of the organic light emitting diode (OLED) via the light emission control transistor T6. The drain electrode D3 of the compensation transistor T3 is connected to the drain electrode D4 of the initialization transistor T4, the first electrode Cst1 of the storage capacitor Cst, and the gate electrode G1 of the driving transistor T1 together.

The gate electrode G4 of the initialization transistor T4 is connected to the previous gate line 152. The source electrode S4 of the initialization transistor T4 is connected to the initialization voltage line 192. The drain electrode D4 of the initialization transistor T4 is connected to the first electrode Cst1 of the storage capacitor Cst and the gate electrode G1 of the driving transistor T1 together through the drain electrode D3 of the compensation transistor T3.

The gate electrode G5 of the operation control transistor T5 is connected to the light emission control line 153. The source electrode S5 of the operation control transistor T5 is connected to the driving voltage line 172. The drain electrode D5 of the operation control transistor T5 is connected to the source electrode S1 of the driving transistor T1 and the drain electrode D2 of the switching transistor T2.

The gate electrode G6 of the light emission control transistor T6 is connected to the light emission control line 153. The source electrode S6 of the light emission control transistor T6 is connected to the drain electrode D1 of the driving transistor T1 and the source electrode S3 of the compensation transistor T3. The drain electrode D6 of the light emission control transistor T6 is connected to the anode of the organic light emitting diode (OLED).

The gate electrode G7 of the bypass transistor T7 is connected to the bypass control line 158. The source electrode S7 of the bypass transistor T7 is connected to the drain electrode D6 of the light emission control transistor T6 and the anode of the organic light emitting diode (OLED) together. The drain electrode D7 of the bypass transistor T7 is connected to the initialization voltage line 192 and the source electrode S4 of the initialization transistor T4 together.

The second electrode Cst2 of the storage capacitor Cst is connected to the driving voltage line 172. The cathode of the organic light emitting diode (OLED) is connected to a common voltage line 741 transmitting the common voltage ELVSS. The common voltage line 741 or the cathode may receive the common voltage ELVSS from the above-described fifth signal line S14.

The circuit structure of the pixel PX is not limited to FIG. 10, and a number of the transistors, a number of the capacitors, and the connection therebetween may be variously changed.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:
1. A display device comprising:
   a display panel comprising:

pixels configured to display an image in a display area;
a first pad area comprising first pads;
a second pad area comprising second pads; and
a driver disposed in a non-display area outside the display area, the driver being configured to transmit a gate signal to the pixels;
a first flexible printed circuit film comprising:
   a third pad area comprising third pads bonded to the first pads;
   a fourth pad area comprising fourth pads; and
   an integrated circuit chip mounted on the first flexible printed circuit film; and
a second flexible printed circuit film comprising:
   a fifth pad area comprising fifth pads bonded to the fourth pads; and
   a sixth pad area comprising sixth pads bonded to the second pads,
wherein the integrated circuit chip is configured to:
   transmit a data signal to the pixels via at least one of the third pads; and
   transmit a gate basic signal to the driver via at least one of the fourth pads and at least one of the sixth pads, the driver being configured to generate the gate signal based on the gate basic signal.

2. The display device of claim 1, wherein the second flexible printed circuit film comprises:
a main body part comprising the fifth pad area; and
an extension projecting from the main body part, the extension comprising the sixth pad area.

3. The display device of claim 2, wherein the second pad area comprises:
a first pad part adjacent to one end of the first pad area; and
a second pad part adjacent to another end of the first pad area.

4. The display device of claim 3, wherein:
the extension comprises:
   a first extending part adjacent to one end of the first flexible printed circuit film; and
   a second extending part adjacent to another end of the first flexible printed circuit film; and
the sixth pad area comprises:
   a first pad part disposed on the first extending part; and
   a second pad part disposed on the second extending part.

5. The display device of claim 4, wherein:
pads of the first pad part of the sixth pad area are bonded to pads of the first pad part of the second pad area; and
pads of the second pad part of the sixth pad area are bonded to pads of the second pad part of the second pad area.

6. The display device of claim 1, wherein the second flexible printed circuit film comprises a stabilization circuit, the stabilization circuit being configured to:
receive the gate basic signal from at least one of the fifth pads; and
transmit at least a portion of the gate basic signal to the at least one sixth pad.

7. The display device of claim 1, further comprising:
a power source module configured to:
generate a voltage to drive the pixels; and
transmit the voltage to the pixels via at least one of the sixth pads.

8. The display device of claim 1, wherein:
the display panel further comprises a lighting circuit portion disposed in the non-display area; and
the integrated circuit chip is configured to transmit a constant voltage to the lighting circuit portion via at least one of the sixth pads.

9. The display device of claim 1, wherein the first pad area and the second pad area are disposed on a line extending in a first direction.

10. The display device of claim 1, wherein the second flexible printed circuit film comprises:
a main body part comprising the fifth pad area;
an extension projecting from the main body part; and
a connection part extending from the extension, the connection part comprising the sixth pad area.

11. The display device of claim 10, wherein the first pad area and the second pad area are disposed along different lines substantially parallel to one another.

12. The display device of claim 10, wherein the first pad area is disposed farther from the display area than the second pad area.

13. A display device comprising:
a display panel configured to display an image, the display panel comprising:
   a first pad area comprising first pads; and
   a second pad area comprising second pads;
a first flexible printed circuit film comprising:
   a third pad area comprising third pads bonded to the first pads;
   a fourth pad area comprising fourth pads; and
   an integrated circuit chip mounted on the first flexible printed circuit film; and
a second flexible printed circuit film comprising:
   a main body part comprising a fifth pad area, the fifth pad area comprising fifth pads bonded to the fourth pads;
   an extension projecting from the main body part; and
   a connection part extending from the extension, the connection part comprising a sixth pad area, the sixth pad area comprising sixth pads bonded to the second pads,
wherein the first pad area is disposed farther from the display area than the second pad area,
wherein the extension comprises:
   a first extending part adjacent to one end of the first flexible printed circuit film; and
   a second extending part adjacent to another end of the first flexible printed circuit film, and
wherein the connection part extends from the first extending part and the second extending part in a direction substantially parallel to a direction of extension of the first pad area.

14. The display device of claim 13, wherein the second flexible printed circuit film comprises an opening defined by the main body part, the first extending part, the second extending part, and the connection part.

15. A The display device comprising:
a display panel configured to display an image, the display panel comprising:
   a first pad area comprising first pads; and
   a second pad area comprising second pads;
a first flexible printed circuit film comprising:
   a third pad area comprising third pads bonded to the first pads;
   a fourth pad area comprising fourth pads; and
   an integrated circuit chip mounted on the first flexible printed circuit film; and
a second flexible printed circuit film comprising:
   a fifth pad area comprising fifth pads bonded to the fourth pads; and a sixth pad area comprising sixth pads bonded to the second pads,
wherein the second flexible printed circuit film overlaps a region between the third pad area of the first flexible printed circuit film and the integrated circuit chip.

16. The display device of claim 15, wherein the second flexible printed circuit film comprises an opening overlapping the integrated circuit chip.

17. The display device of claim 1, wherein the first pad area is farther from the display area than the second pad area.

18. The display device of claim 17, wherein a part of the display panel comprising the first pad area projects outwardly away from the display area farther than a part of the display panel comprising the second pad area.

* * * * *